US009909215B2

(12) United States Patent
Holber et al.

(10) Patent No.: US 9,909,215 B2
(45) Date of Patent: Mar. 6, 2018

(54) METHOD OF CVD PLASMA PROCESSING WITH A TOROIDAL PLASMA PROCESSING APPARATUS

(71) Applicant: Plasmability, LLC, Austin, TX (US)

(72) Inventors: William Holber, Winchester, MA (US); Robert J. Basnett, Austin, TX (US)

(73) Assignee: Plasmability, LLC, Austin, TX (US)

( * ) Notice: Subject to any disclaimer, the term of this patent is extended or adjusted under 35 U.S.C. 154(b) by 2 days.

(21) Appl. No.: 15/489,979

(22) Filed: Apr. 18, 2017

(65) Prior Publication Data

US 2017/0298513 A1 Oct. 19, 2017

Related U.S. Application Data

(62) Division of application No. 14/212,073, filed on Mar. 14, 2014, now abandoned.

(60) Provisional application No. 61/910,387, filed on Dec. 1, 2013, provisional application No. 61/791,274, filed on Mar. 15, 2013.

(51) Int. Cl.
| | |
|---|---|
| *C23C 16/26* | (2006.01) |
| *C23C 16/505* | (2006.01) |
| *C23C 16/27* | (2006.01) |
| *C23C 16/507* | (2006.01) |
| *H01J 37/32* | (2006.01) |
| *H05H 1/46* | (2006.01) |

(52) U.S. Cl.
CPC ............ *C23C 16/505* (2013.01); *C23C 16/26* (2013.01); *C23C 16/272* (2013.01); *C23C 16/507* (2013.01); *H01J 37/321* (2013.01); *H01J 37/3266* (2013.01); *H01J 37/32357* (2013.01); *H01J 37/32458* (2013.01); *H01J 37/32669* (2013.01); *H05H 1/46* (2013.01); *H05H 2001/4667* (2013.01)

(58) Field of Classification Search
CPC ....... C23C 16/26; C23C 16/27; C23C 16/272; C23C 16/505
See application file for complete search history.

(56) References Cited

U.S. PATENT DOCUMENTS

| | | | | |
|---|---|---|---|---|
| 5,349,154 A | * | 9/1994 | Harker .................. | C30B 25/105 117/102 |
| 5,397,428 A | * | 3/1995 | Stoner .................... | C23C 16/02 117/103 |
| 6,150,628 A | | 11/2000 | Smith et al. | |
| 6,238,588 B1 | | 5/2001 | Collins et al. | |
| 6,388,226 B1 | | 5/2002 | Smith et al. | |
| 6,392,351 B1 | | 5/2002 | Shun'ko | |
| 6,486,431 B1 | | 11/2002 | Smith et al. | |
| 6,552,296 B2 | | 4/2003 | Smith et al. | |
| 6,559,408 B2 | | 5/2003 | Smith et al. | |
| 6,664,497 B2 | | 12/2003 | Smith et al. | |
| 6,815,633 B1 | | 11/2004 | Chen et al. | |
| 6,924,455 B1 | | 8/2005 | Chen et al. | |
| 6,927,358 B2 | | 8/2005 | Gonzales et al. | |
| 7,161,112 B2 | | 1/2007 | Smith et al. | |
| 7,166,816 B1 | | 1/2007 | Chen et al. | |
| 7,541,558 B2 | | 6/2009 | Smith et al. | |
| 7,569,790 B2 | | 8/2009 | Holber et al. | |
| 8,124,906 B2 | | 2/2012 | Holber et al. | |
| 8,779,322 B2 | | 7/2014 | Holber et al. | |
| 2002/0157703 A1 | | 10/2002 | Cox et al. | |
| 2002/0157793 A1 | | 10/2002 | Cox et al. | |
| 2002/0179250 A1 | | 12/2002 | Veltrop et al. | |
| 2004/0079287 A1 | | 4/2004 | Smith et al. | |
| 2005/0000655 A1 | * | 1/2005 | Wi ..................... | H01J 37/32357 156/345.48 |
| 2005/0010209 A1 | * | 1/2005 | Lee, Jr. .............. | A61B 18/1206 606/41 |
| 2005/0136604 A1 | | 6/2005 | Al-Bayati et al. | |
| 2005/0202173 A1 | * | 9/2005 | Mills ....................... | B01J 19/088 427/249.7 |
| 2006/0233699 A1 | * | 10/2006 | Mills ....................... | B01J 19/088 423/648.1 |

(Continued)

FOREIGN PATENT DOCUMENTS

| | | |
|---|---|---|
| CN | 1723529 A | 1/2006 |
| CN | 101939812 A | 1/2011 |

(Continued)

OTHER PUBLICATIONS

Zvanya, John, et al., "Toroidal plasma enhanced CVD of diamond films". J. Vac. Sci. Technol. A 32(5), Sep./Oct. 2014, 050605-1 to 050605-6.*

Matsumoto, Seiichiro, et al., "Synthesis of diamond films in a rf induction thermal plasma". Appl. Phys. Lett., vol. 51, No. 10, Sep. 7, 1987, pp. 737-739.*

Gicquel, Alix, et al., "CVD diamond films: from growth to applications". Current Applied Physics 1 (2001) 479-496.*

Awakowicz, Peter, et al., "Diamond deposition and plasma diagnostics in a 27 MHz inductive coupled reactor (ICP)". Diamond and Related Materials 6 (1997) 1816-1823.*

(Continued)

*Primary Examiner* — Bret P Chen
(74) *Attorney, Agent, or Firm* — Kurt Rauschenbach; Rauschenbach Law Group, LLC

(57) ABSTRACT

A method of CVD plasma processing for depositing at least one of diamond, diamond-like-carbon, or graphene includes forming a vacuum chamber comprising a conduit and a process chamber. A gas is introduced into the vacuum chamber. An RF electromagnetic field is applied to a magnetic core to form a toroidal plasma loop discharge in the vacuum chamber. A workpiece is positioned in the process chamber for plasma processing at a distance from a hot plasma core to a surface of the workpiece that is in a range from 0.1 cm to 5 cm. A gas comprising hydrogen is introduced to the workpiece so that the toroidal plasma loop discharge generates atomic hydrogen.

28 Claims, 11 Drawing Sheets

(56) References Cited

U.S. PATENT DOCUMENTS

| | | | | |
|---|---|---|---|---|
| 2009/0017258 A1* | 1/2009 | Carlisle | ............... | C23C 16/271 428/143 |
| 2010/0209311 A1* | 8/2010 | Mills | ..................... | B01J 19/088 422/186.03 |
| 2010/0242834 A1* | 9/2010 | Bhandari | ............. | C30B 25/105 117/97 |
| 2011/0171118 A1* | 7/2011 | Hofmann | ............. | B01D 53/229 423/652 |

FOREIGN PATENT DOCUMENTS

| | | | |
|---|---|---|---|
| KR | 10-2006-0092427 | A | 8/2006 |
| WO | 2004022821 | A1 | 3/2004 |
| WO | 2004046427 | A1 | 6/2004 |

OTHER PUBLICATIONS

Shafranov, V.D., et al., Plasma Physics (Journal of Nuclear Energy Part C) 1963, vol. 5, pp. 251-258.*

Kosuga, Y., et al., "Conversion of poloidal flows into torioidal flows by phase space structures in trapped ion resonance driven turbulence". Plasma Phys. Control. Fusions 55 (2013) 125001, pp. 1-7.*

Chen, James, "Effects of Toroidal Forces in Current Loops Embedded in a Background Plasma". The Astrophysical Journal, 338: 453-470, Mar. 1, 1989.*

"Office Action" for Chinese Patent Application No. 201480014623. 2, dated Jun. 19, 2017, 9 pages, State Intellectual Property Office of the People's Republic of China, China.

"Office Action" for Chinese Patent Application No. 201480014623. 2, dated Aug. 29, 2016, 17 pages, State Intellectual Property Office of The People's Republic of China, Beijing, China.

"Suplementary European Search Report" for European Patent Application No. 14763433.1, dated Jul. 11, 2016, 8 pages, European Patent Office, Munich, Germany.

Notification Concerning Transmittal of International Preliminary Report on Patentability(Chapter I of the Patent Cooperation Treaty) for PCT/US2014/027881, dated Sep. 24, 2015, 10 pages, The International Bureau of WIPO, Geneva, Switzerland.

"Notification of Transmittal of the International Search Report and the Written Opinion of the International Searching Authority, or the Declaration" for PCT/US2014/027881, dated Aug. 6, 2014, 14 pages, International Searching Authority/KR, Daejeon Metropolitan City, Republic of Korea.

* cited by examiner

METHOD OF CVD PLASMA PROCESSING WITH A TOROIDAL PLASMA PROCESSING APPARATUS

CROSS-REFERENCE TO RELATED APPLICATION

This application is a divisional application of U.S. patent application Ser. No. 14/212,073, entitled "Toroidal Plasma Processing Apparatus" filed on Mar. 14, 2014 which claims priority to U.S. Provisional Patent Application No. 61/910,387, entitled "Plasma Apparatus for the Deposition of Diamond, Diamond-Like Carbon, Graphene and Related Materials" filed on Dec. 1, 2013, and also claims priority to U.S. Provisional Patent Application No. 61/791,274, entitled "Plasma Apparatus for the Deposition of Diamond, Diamond-Like Carbon, Graphene and Related Materials" filed on Mar. 15, 2013. The entire contents of U.S. patent application Ser. No. 14/212,073, U.S. Provisional Patent Application No. 61/910,387 and U.S. Provisional Patent Application No. 61/791,274 are herein incorporated by reference.

The section headings used herein are for organizational purposes only and should not to be construed as limiting the subject matter described in the present application in any way.

INTRODUCTION

There are many types of plasma discharges and they operate under a wide range of conditions. In some applications, pressures as low as $10^{-3}$ Torr are used. At low pressure, dissociation mainly occurs due to electron impact on molecules. Heating of the gaseous species plays a relatively minor role in the dissociation processes. In other applications, much higher gas pressures are used that can be from 1 Torr to greater than 1 atm. Dissociation of molecules occurs due to a combination of electron impact plus heating of the gaseous species. Generally, the most efficient dissociation occurs when the pressure and gas temperature are both relatively high. Gas temperatures can exceed several thousand degrees Centigrade when the gas pressure is 1 Torr or greater and the electrical power absorbed in the plasma is greater than 10 W $cm^{-3}$. At these high gas temperatures, thermal effects begin to play an important role in maintaining a highly dissociated gas.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The person skilled in the art will understand that the drawings, described below, are for illustration purposes only. The drawings are not necessarily to scale, emphasis instead generally being placed upon illustrating principles of the teaching. The drawings are not intended to limit the scope of the Applicants' teaching in any way.

DESCRIPTION OF VARIOUS EMBODIMENTS

Figure 1:
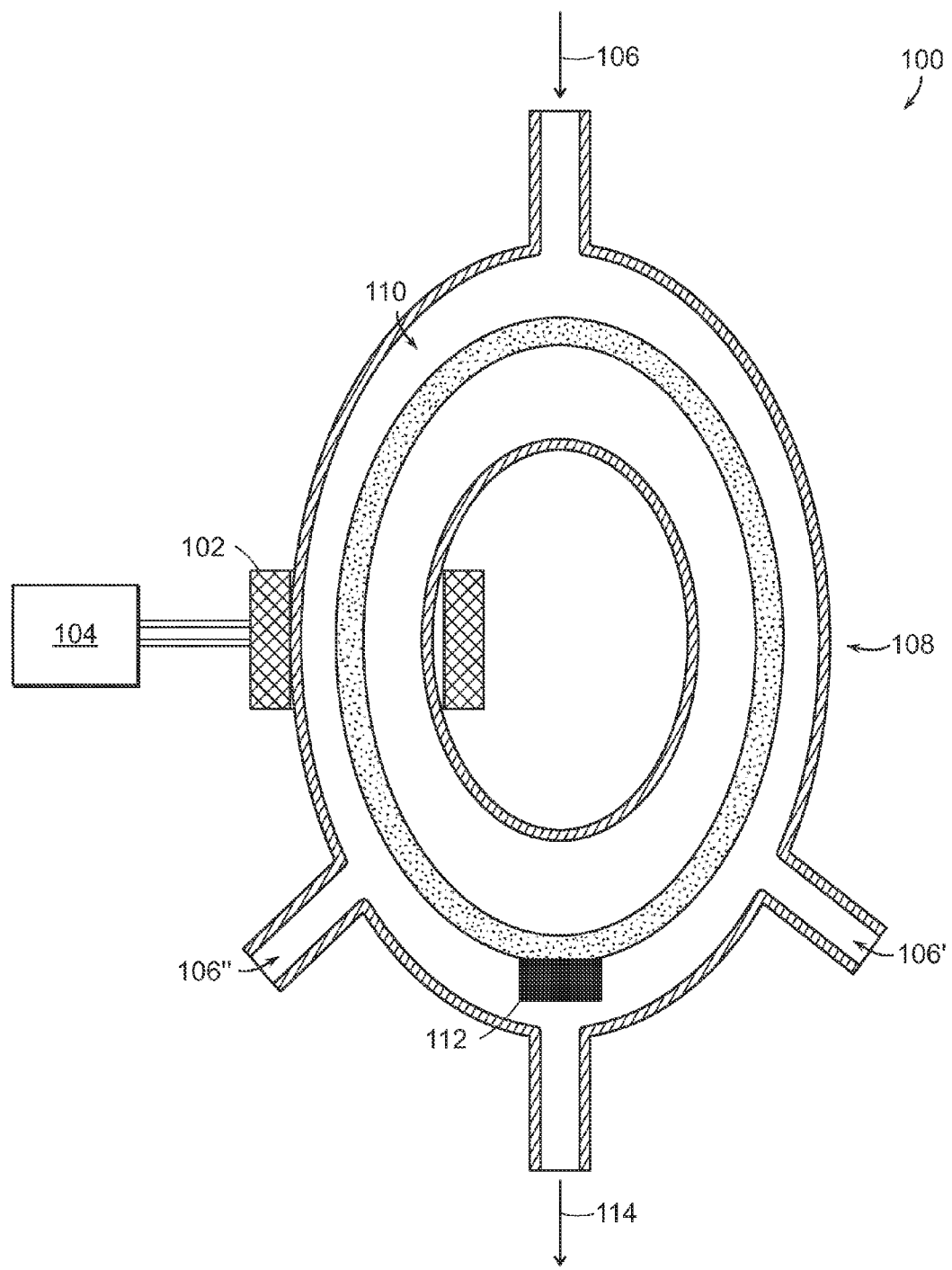
FIG. 1 illustrates a toroidal plasma source according to one embodiment of the present teaching having a magnetic core and power supply where inert and process gases can be introduced at one point or at multiple points.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teaching may be performed in any order and/or simultaneously as long as the teaching remains operable. Furthermore, it should be understood that the apparatus and methods of the present teaching can include any number or all of the described embodiments as long as the teaching remains operable.

The present teaching will now be described in more detail with reference to exemplary embodiments thereof, as shown in the accompanying drawings. While the present teaching is described in conjunction with various embodiments and examples, it is not intended that the present teaching be limited to such embodiments. On the contrary, the present teaching encompasses various alternatives, modifications, and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to using plasma discharges for dissociating molecular gases. One aspect of the apparatus and methods of the present teaching relates to forming diamond, diamond-like carbon, graphene, and related materials using plasma discharges for dissociating molecular gases. Synthetic diamond materials have been produced for many years by a variety of means. Early synthetic diamond processing techniques include thermal torches and high pressure, high temperature reactors. Beginning in the 1980's, investigators began looking at plasma techniques to generate synthetic diamond films. These were typically thin or thick films of diamond material, deposited onto substrates such as silicon, tungsten, and molybdenum. These reactor types are generally referred to as plasma chemical vapor deposition reactors, or plasma CVD reactors. Much of the initial development of plasma CVD diamond deposition has been performed using microwave-based reactors operating in the general pressure range of 10-100 Torr. Other diamond deposition has been done using lower pressure plasma reactors and non-microwave generators. In general, higher-quality films and higher deposition rates have been obtained using the higher pressure microwave systems. See, for example, J. E. Butler, Y. A. Mankelevich, A. Cheesman, Jie Ma and M. N. R. Ashfold, "Understanding the Chemical Vapor Deposition of Diamond: Recent Progress", Journal of Physics: Condensed Matter 21 (2009) 364201, IOP Publishing. See also, F. Silva, K. Hassouni, X. Bonnin and A. Gicquel, "Microwave Engineering of Plasma-Assisted CVD Reactors for Diamond Deposition," Journal of Physics: Condensed Matter 21 (2009) 364202 IOP Publishing. All the references cited herein including J. E. Butler et al., and F. Silva et al. are herein incorporated by reference.

The plasma chemistry for depositing diamond, diamond-like carbon, graphene, and related materials includes mainly hydrogen chemistry with the addition of a small amount of a carbon-containing gas, such as methane or acetylene. Other gases containing carbon and hydrogen may be used. In addition, other gases can be added such as nitrogen, oxygen, or a halogen species. The plasma dissociates some fraction of the hydrogen as well as the carbon-containing species. Atomic hydrogen is a critical ingredient because it adsorbs onto the growing diamond surface and also preferentially etches away carbon-bonds in favor of diamond bonds. The key to both high deposition rates and high quality film growth is to have a high flux of atomic hydrogen at the workpiece surface. The term "workpiece" is defined herein to be the object on which material is being deposited. In other words, the workpiece is the sample or device being processed according to the methods and apparatus of the present teachings.

Many types of plasma discharges generate the conditions necessary for high flux of atomic hydrogen. However, most of these plasma discharges show significant disadvantages for many practical applications. For example, plasma torches operating at atmospheric pressure can generate very high gas temperatures and are very effective in dissociating a variety of molecular gases. However, the torch electrodes have limited lifetimes. Also, erosion of plasma torch electrodes generates contamination that is unacceptable for many applications. In addition, it is difficult for plasma torches to generate uniform discharges over large areas.

Inductive RF plasma sources are commonly used in semiconductor processing equipment. Inductive RF plasma sources operate at frequencies that are typically between 2 MHz and 60 MHz. However, as the power density and/or pressure are raised, serious plasma chamber erosion can occur. The desired high plasma density and gas pressure for generating a high flux of atomic hydrogen is difficult to attain in traditional inductive plasma sources. Also, power supplies used to drive inductively coupled plasmas are typically not very efficient. Furthermore, there are significant coupling losses between the power supply and the plasma. Compensating for these losses substantially adds to the cost and complexity of the plasma generator because larger power supplies are needed and because these systems often require cooling.

Microwave discharge sources are also commonly used in semiconductor processing equipment and many other applications. These sources operate at pressures ranging from less than $10^{-3}$ Torr to greater than one atm. However, microwave generators are notoriously inefficient. Microwave generators typical have an overall efficiency of only about 50% (AC line to microwave power). In addition, the magnetron tubes in these generators typically need to be replaced on a routine basis, which significantly adds to the operating cost and down time of the system. In addition, specialized and costly waveguide components are needed to couple the power from the microwave generator to the plasma. The microwave coupling components and generator are also large in size and weight, which limits their application, especially in a clean room environment.

Microwave plasma reactors are commonly used to deposit diamond. In these reactors, the typical gaseous species include hydrogen and a carbon-containing gas such as methane, and may include quantities of other gases such as oxygen, nitrogen, and halogen species. Carbon-containing species other than methane have also been used. High performance microwave diamond CVD reactors apply a high atomic hydrogen flux to the workpiece surface in various ways alone or in combination, such as by operating at high pressures (10-100+ Torr), high neutral gas temperature (2000° C. or greater), and/or by positioning the workpiece surface at a short distance from the plasma core where atomic hydrogen is generated. Operating at short distances from the plasma core is desirable because at typical pressures in the process chamber, both gas-phase recombination and wall reactions will cause loss of atomic hydrogen.

The workpiece needs to be less than five centimeters from the hot core of the plasma in some configurations so that optimum transport of atomic hydrogen to the workpiece surface is achieved. In many cases, depending on the gas pressure, the optimum distance from the hot core of the plasma to the substrate can be a millimeter or less. At these power densities and close substrate distances to the plasma core, there will be very significant heating of the substrate. This heating can be advantageous by providing the energy at the growth surface necessary to heat the workpiece to the desired deposition temperature.

The plasma and surface chemistry in microwave plasma reactors that are commonly used to deposit diamond have been extensively studied, and it is well known that production of atomic hydrogen in the plasma and its use on the workpiece surface is critical to the process. The deposition rate and the material quality increase as the reactor becomes more efficient at dissociating the molecular hydrogen into atomic hydrogen and efficiently delivering it to the workpiece surface. Also, when atomic hydrogen impinges onto the workpiece surface, there is a high probably that the atomic hydrogen will recombine into molecular hydrogen, liberating a large amount of energy which will transfer to the workpiece, causing it to rise in temperature. This can be advantageous in processes which require high workpiece temperatures, such as the deposition of diamond, graphene, and similar materials. By utilizing the atomic hydrogen for workpiece heating, the need for supplemental heating can be reduced or avoided completely, reducing energy costs, equipment complexity, and equipment cost.

One aspect of the present teaching is the use of a toroidal plasma to generate atomic hydrogen that effectively and efficiently deposits a variety of materials, including diamond, diamond-like carbon, graphene, and other carbon-based materials. A toroidal plasma is defined herein as a plasma that completes a closed loop. Toroidal plasmas have been used in commercial material processing applications for several years. One known toroidal plasma apparatus for material processing is described in U.S. Pat. No. 6,150,628, which is incorporated herein by reference. Toroidal plasmas as described herein generally have one or more of the following characteristics: (1) the plasma is generated in a closed loop; (2) one or more magnetic cores surround a portion of the plasma loop; and (3) an RF power supply is connected to a primary winding of the magnetic core so that power is coupled through the magnetic core to the plasma loop, which is effectively the secondary of the transformer circuit.

Thus, one feature of the toroidal plasma source of the present teaching is that non-microwave power can be used to initiate and maintain a plasma discharge that can create conditions similar to those found in successful microwave plasma diamond CVD reactors. The partial pressure of active gases may be 1 Torr and greater in some configurations. The absorbed RF power can be 10 W cm$^{-3}$ and greater.

The toroidal plasma apparatus of the present teaching has numerous applications. One application of the toroidal plasma apparatus of the present teaching is to deposit a variety of materials, such as diamond. However, it is understood that the present teachings are not limited to depositing diamond. Another application of the toroidal plasma apparatus of the present teaching is to etch or clean workpiece surfaces. Etching or cleaning can be accomplished by exposure to charged species created in the plasma discharge and/or by exposure to reactive neutral species created in the plasma discharge. Another application of the toroidal plasma apparatus of the present teaching is a reactive gas source. In this application, the source will be configured and operated such that predominantly uncharged reactive gas species reach the workpiece surface. Yet another application of the toroidal plasma source is for deposition or etching on a moving roll-to-roll web based workpiece platen. Such a system includes at least a supply roller and a return roller which transports a web through the process chamber. For example, see U.S. Patent Publication No. 2010-0310766 A1, which is incorporated herein by reference. These moving roll-to-roll web based workpiece platens can support web-type substrates like solar cells or can support conventional substrates.

Toroidal plasma sources are particularly useful for applications where a very high gas temperature in the plasma is desirable. For example, a very high gas temperature in the plasma region is desirable when processing with hydrogen in order to promote the dissociation of atomic hydrogen from molecular hydrogen and to maintain a high degree of dissociation. In particular, gas temperatures in excess of 2,000 C have been found to be desirable. In many processes according to the present teaching, gas temperatures above 3,000 C result in particularly favorable conditions for both high deposition rates and high quality of deposited diamond material. It is also desirable to have very high gas temperatures in the plasma region when using atomic nitrogen, oxygen, fluorine, chlorine, bromine, iodine, and numerous hydrocarbons. In general, the higher the gas temperature in the plasma, the more effective the production of atomic species.

In addition, toroidal plasma sources, according to the present teaching, are particularly useful for applications with reactive gaseous species where the plasma is difficult to maintain within a narrowly confining plasma processing chamber and where the plasma or its products interact with the walls. Atomic hydrogen is an example of a reactive gas that is difficult to maintain within a narrowly confining plasma processing chamber, due to its high recombination rate on surfaces and its high chemical activity when dissociated. Hydrogen is used for applications such as cleaning semiconductor wafer surfaces and removing photoresist from semiconductor wafers after lithography process steps. Hydrogen is also used for depositing a variety of carbon-based materials, such as diamond, diamond-like carbon, and graphene. Thus, one important application of the toroidal plasma apparatus of the present teaching is to deposit diamond, diamond-like carbon, graphene, and other carbon-based materials. Other gasses that are difficult to maintain for similar reasons within a narrowly confining plasma processing chamber include atomic nitrogen, oxygen, fluorine, chlorine, bromine, iodine, ammonia, and numerous hydrocarbons, fluorocarbons, and other molecular species.

FIG. 1 illustrates a toroidal plasma source 100 according to one embodiment of the present teaching having a magnetic core 102 and power supply 104 where inert and process gases can be introduced at one point 106 or at multiple points 106, 106', and 160". The toroidal plasma source 100 includes a plasma chamber 108 that can be formed from insulating or conductive materials, or a combination of the two. The plasma chamber 108 is not a purely conductive construction. The magnetic core 102 surrounds the plasma chamber 108. It may also be desirable in some embodiments to have the magnetic core positioned within the vacuum chamber itself, where it can surround a section of the plasma loop. The RF power supply 104 has an output that is connected to the primary windings of the magnetic core 102. The RF power supply 104 is used to energize the magnetic core 102, which in turn causes an electric field to be coupled into a plasma discharge 110.

In various embodiments, inert and process gases are introduced at one point or at multiple points in the plasma chamber 108. In the embodiment shown in FIG. 1, the toroidal plasma source 100 includes a first 106, a second 106', and a third 106" gas inlet. Using multiple gas inlets provides the capability of separating active and noble gas species along different sections of the plasma loop.

Using two gas inlets provides the capability of separating active and noble gas species along different sections of the plasma loop. The terms "active gas" and "reactive gas" as used herein refers to gases that are part of the process chemistry. In contrast, noble gases, such as argon, are primarily used to assist in sustaining the plasma discharge, though they may, in some processes, play a role in the dissociation process of the active gases.

Gases are introduced at multiple gas input ports in the plasma chamber 100 for various reasons, depending upon the process. Gas input ports as defined herein can be any type of gas input port, such as single or multiple apertures, single or multiple slits, or shower heads. For example, argon gas can be introduced at one location because less power and voltage are required to create and sustain a plasma discharge with argon compared with other gases. The argon gas is also chemically inert, so that the portions of the plasma chamber exposed to the argon discharge will require less complex and costly materials of construction, as compared to portions of the plasma chamber exposed to hydrogen and other active gases. The workpiece 112 being processed can be positioned near an outlet 114 to the vacuum pump as shown in FIG. 1. Other configurations displace the workpiece 112 being processed from the outlet 114 to the vacuum pump. Many embodiments using argon gas introduce it at a point away from the workpiece 112, while the hydrogen gas, inert, and other process gases are introduced closer to the workpiece 112. Such a configuration will result in more power being dissipated proximate to the workpiece 112, where it is needed in order to provide atomic hydrogen to the workpiece 112 surface.

Calculations indicate significant gas separation will occur under a wide range of gas flows and pressures. For example, for argon flow rates of 200 sccm or greater, hydrogen flow rates of 200 sccm or less, and pressures greater than 10 Torr, significant gas separation will occur along the plasma loop 110. In various embodiments, additional pumping channels and gas input ports are included to increase the amount of gas separation. In some methods and configurations, the plasma source 100 is operated such that the partial pressure of process gases is in the pressure range of 1 Torr to 100 Torr. However, the present teachings described herein are not limited to specific pressure ranges.

Another reason for introducing gas at a multiplicity of gas input ports is to provide a desired gas flow pattern or to optimize the flow patterns for particular parameters. For example, a plurality of gas input ports with varying sizes and/or spacing patterns can be used to achieve a desired flow pattern or to optimize the flow of gas. The optimized flow can enhance uniformity on both fixed and rotating substrates.

In various embodiments, the workpiece 112 can be in intimate contact with or positioned adjacent to the plasma. In some embodiments, the workpiece 112 is introduced into the toroidal plasma region, in close proximity to the hot plasma core, where it receives adequate flux of atomic hydrogen to deposit high quality films. In one specific embodiment, the workpiece 112 is less than 2 cm from the hot core of the plasma. In this embodiment, a typical distance from the hot plasma core to the workpiece surface is in the range of 1 mm to 5 cm.

In the embodiment shown in FIG. 1, a 400 kHz power supply 104 is shown. In various embodiments, the frequency of the RF power supply 104 is generally between about 60 Hz and 100 MHz. However, various factors, including practical limits on power supplies and the desirability of minimizing overall system cost and the weight of the magnetic core, limit the practical frequency range in many embodiments to between about 20 kHz and 14 MHz. This frequency range is also desirable to maximize the transfer of power from the power supply 104 to the plasma, while avoiding capacitive coupling. In some embodiments, the toroidal plasma source 100 is operated with a power density in the plasma of 10 W cm$^{-3}$ and greater. In other embodiments, the power density is higher than 100 W cm$^{-3}$.

One feature of the toroidal plasma source 100 described in connection with FIG. 1 is that a microwave cavity is not required to form the plasma. Microwave cavities have numerous disadvantages, such as a tendency to form an arc discharge. In practice, microwave cavities have a much more limited process parameter space and are much more limited in where the workpiece 112 can be positioned compared with other means of forming a plasma discharge. Microwave cavities also provide a limited range of opportunities to tailor the plasma shape to what might be desirable for particular workpiece types.

Another feature of the toroidal plasma source 100 described in connection with FIG. 1 is that active tuning or matching of the power supply 104 to the plasma load is not generally required, which reduces the complexity and cost. However, in some situations tuning or matching is desirable. Yet another feature of the toroidal plasma source 100 is that the electric fields and voltages inside the device are small compared to those found in a microwave source or more conventional RF plasma source, which improves reliability and reduces erosion of interior surfaces exposed to the plasma environment.

Figure 2:
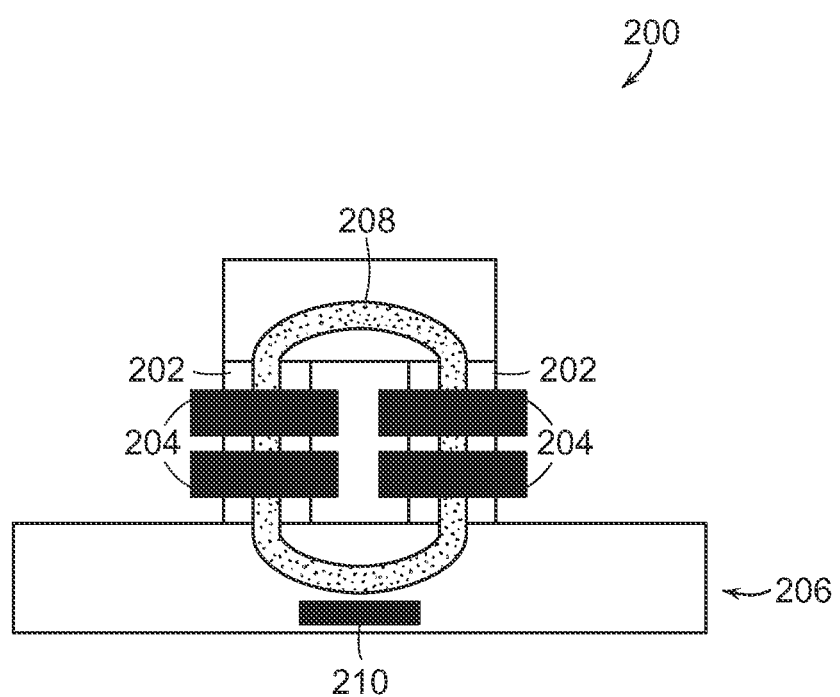
FIG. 2 illustrates a toroidal plasma processing apparatus according to the present teaching illustrating the plasma conduits and magnetic cores.

FIG. 2 illustrates a toroidal plasma processing apparatus 200 according to the present teaching illustrating plasma conduits 202 and magnetic cores 204. The term "conduit" as defined herein means a structure designed to contain a section of a toroidal discharge, but that is not intended as a structure where substantial processing of materials and/or gases is performed. Conduits 202 in many embodiments of the present teaching have different geometries compared with the process chamber 206 so that the pressure and concentration of inert and process gasses in the conduits 202 are different from the pressure and concentration in the process chamber 206. The term "process chamber" is defined herein as a section of the vacuum chamber where one or both of material and gasses are processed. Thus, the term "process chamber" is defined more generally than some of the relevant art. The process chambers shown in the figures are only some of many possible process chamber configurations. In various configurations, different portions of the vacuum chamber can be constructed of different materials or the same material, depending on the process chemistries. For some applications, it is desirable to provide argon purging in some sections of the plasma chamber to reduce the concentration of process gases.

FIG. 2 illustrates one configuration of the conduits 202 and magnetic core 204 or cores in a toroidal plasma source 200 according to the present teaching. The toroidal plasma source 200 is well suited for a wide range of purposes, including the generation of atomic hydrogen for use in the deposition of materials such as diamond, diamond-like carbon, graphene, and other materials requiring atomic hydrogen in the deposition process. It can also be used for numerous other chemistries and processes, including surface cleaning and modification.

The plasma processing apparatus 200 includes two substantially straight conduits 202. The plasma 202 closes the toroidal plasma loop on either end of the conduits. One feature of the geometry of this embodiment is that straight conduits 202 are available in a wide variety of materials and can be fabricated at significantly lower cost compared with more complex shaped conduits. Another feature of the geometry of this embodiment is that the plasma 208 turns along its toroidal path when it is within a larger vacuum chamber. Consequently, heat from the discharge is most concentrated where the plasma 208 turns. This region of more concentrated heat is more susceptible to erosion from both heat and chemical attack. Thus, physical sputtering from ions is moved into the larger volume regions where there is more surface area to absorb the heat.

In various embodiments, the plasma conduits 202 can be fabricated from numerous different types of dielectric material, such as fused silica, alumina, aluminum nitride, sapphire, and other ceramics and glasses. The plasma conduits 202 can also be fabricated from conductive materials such as aluminum, various steels, copper, tungsten, molybdenum, etc. In embodiments using conductive or dielectric materials, an electrically insulating coating can be applied to the inside wall of the plasma conduit in order to inhibit electrical arcing or erosion. In the case of conductive materials, the conduits 202 can be mounted with an insulating collar or washer to prevent electrical shorting to the chambers to which they are connected. The temperature of the conduits 202 and magnetic cores 206 can be controlled in numerous ways. For example, the conduits 202 and magnetic cores 206 can be cooled by performing air convection, direct fluid cooling, or by one or more cooling elements being placed in intimate contact with the exterior surface of the conduits 202 and/or magnetic cores 206.

In known toroidal plasma sources, process gas chemistry is often incompatible with the wall materials of the plasma processing chamber. This incompatibility effectively limits the process gases that may be used. Another feature of the toroidal plasma source 200 of the present teaching is that the apparatus of the present teaching can use a process gas chemistry that is incompatible with the wall material of traditional plasma processing chamber.

In known toroidal plasma sources, a large fraction of the plasma loop is primarily used only to maintain the plasma. Maintaining the plasma consumes energy, without providing a process benefit for many applications. Another feature of the toroidal plasma source 200 of the present teaching is that it reduces the fraction of the total plasma power that is used only to maintain the plasma 208. In various embodiments, the toroidal plasma source 200 of the present teaching may utilize 100% of the plasma path length for process gases in some embodiments, and as little as 5% of the plasma path length in other embodiments.

In known toroidal plasma sources, the plasma loop is confined in a closed vacuum chamber in which the hottest part of the plasma is distant from the workpiece. Another feature of the plasma processing apparatus of the present teaching is that it allows the workpiece 210 to be directly adjacent to, or in the vicinity of, the high-temperature plasma 204 core.

Figure 3:
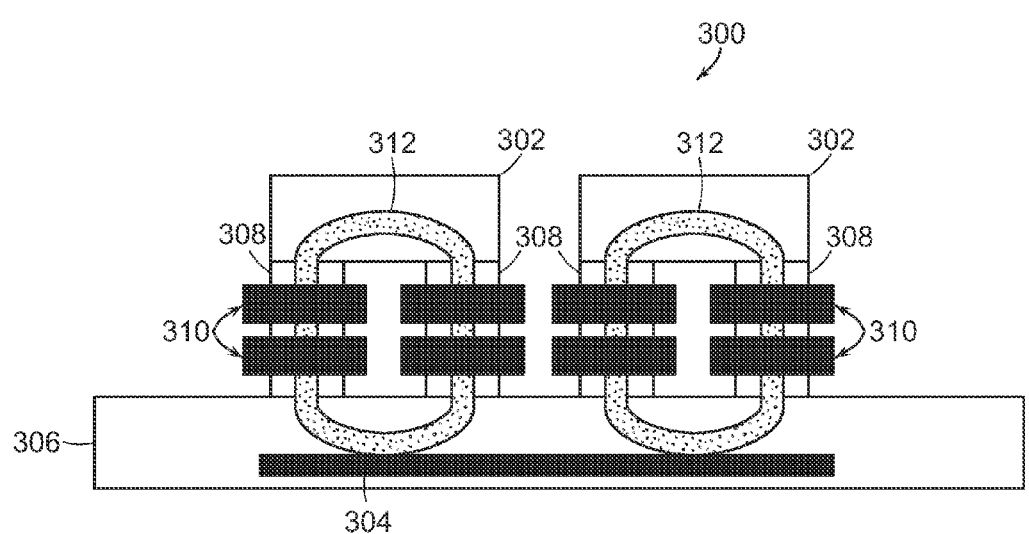
FIG. 3 illustrates a toroidal plasma processing apparatus of the present teaching where multiple plasma sources are stacked across the width or along the length of a workpiece.

FIG. 3 illustrates a toroidal plasma processing apparatus 300 of the present teaching where multiple plasma sources 302 are stacked across the width or along the length of a workpiece 304. In this geometry, the stacked toroidal plasma sources 302 can be overlapped and offset in various configurations, thus allowing the uniformity of the process to be controlled. Each of the toroidal plasma sources 302 includes conduits 308, and at least one magnetic core 310. The process chamber 306 is common to both toroidal plasma sources. The plasma flux 312 for each pair of conduits 308 can be kept discrete from the other pairs. In other embodiments, the plasma flux 312 is linked conduit-to-conduit. Such geometries are well suited for both large-area discrete workpieces 304 and for roll-to-roll or web deposition systems where a workpiece 304 is continuously moved within a process chamber to either deposit material, etch material, or modify surface properties of the material. One feature of the plasma processing apparatus 300 described herein is that toroidal plasma sources can be arrayed along the width or length of the fixed or moving workpiece 304 in order to control the uniformity and rate of the process.

In some embodiments, the plasma processing apparatus 300 of the present teaching share a single connecting chamber 302 in addition to the single process chamber 306. In such configurations, the single connecting chamber 302 can be used as a second process chamber. In this configuration, two moving or two fixed workpieces can be simultaneously processed. In embodiments where two workpiece chambers are used, the same or different gas mixtures may be introduced into the different workpiece chambers.

The plasma processing apparatus 300 with multiple plasma sources is well suited for fixed discrete substrates, such as glass pieces, which are commonly moved from one process chamber 306 to the next. The plasma processing apparatus 300 can be used to deposit materials, clean, or modify the surface. Examples of devices suitable for processing with the plasma processing apparatus 300 are photovoltaics and displays.

The plasma processing apparatus 300 with multiple plasma sources is also well suited to deposit uniform films over a large area because of its ability to rotate, translate, or otherwise move the workpiece 304 underneath the plasma 312 region. In various embodiments, the movement of the workpiece 304 can be controlled both to provide uniform film deposition and to control the temperature of the workpiece 304 by averaging the power from the plasma source over a larger workpiece 304 area. In various embodiments, the movement of the workpiece can be pure rotation or pure translation or a combination of rotation and translation. In some embodiments, the toroidal plasma source 300 itself is rotated and/or translated to improve plasma 302 uniformity. In some embodiments, both the workpiece 304 and the toroidal plasma source 300 are rotated and/or translated relative to each other to improve uniformity.

Figure 4:
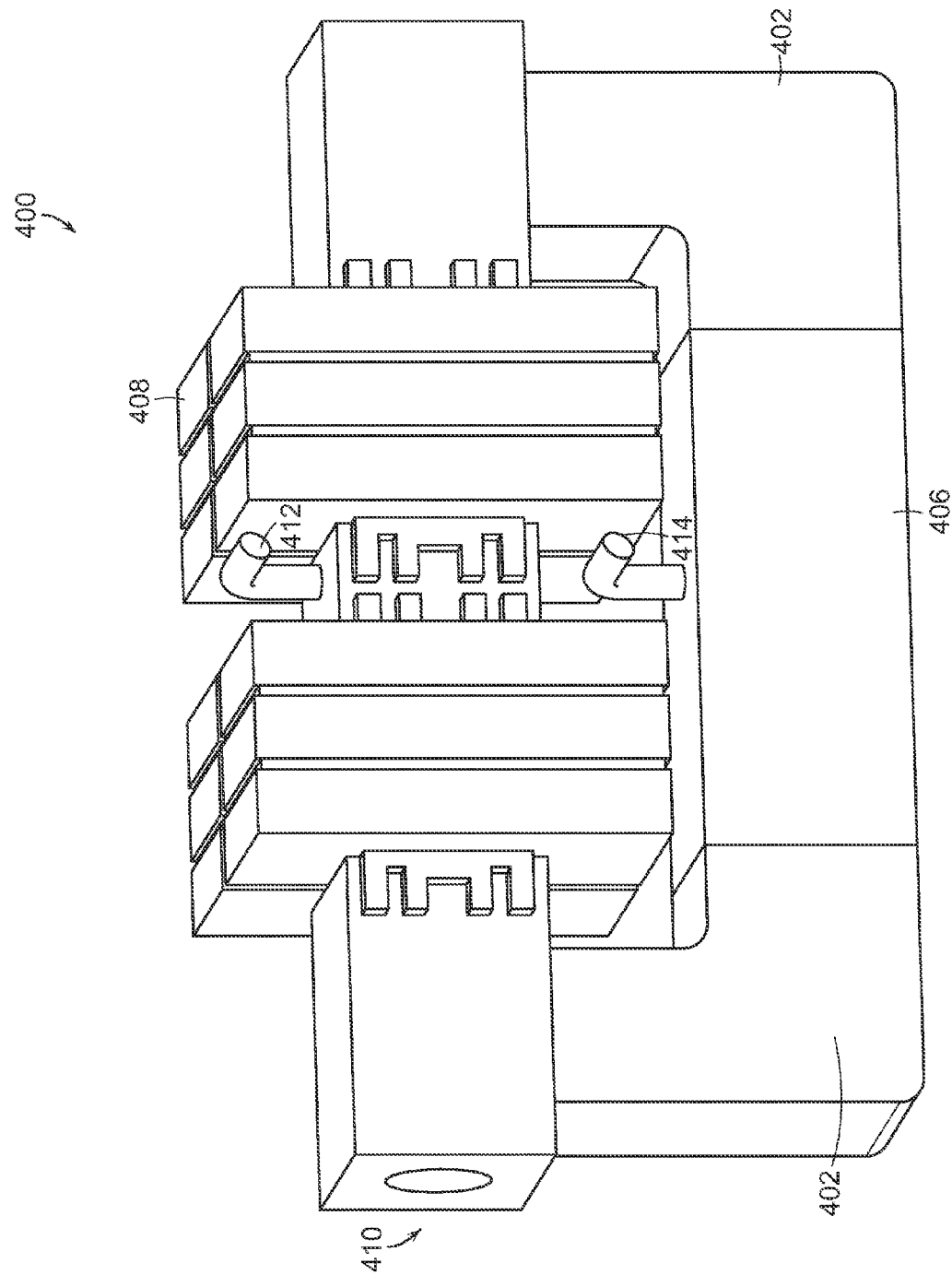
FIG. 4 illustrates a perspective view of a toroidal plasma processing apparatus according to the present teaching that includes a vacuum chamber for plasma processing with functionally separate portions.

FIG. 4 illustrates a perspective view of a toroidal plasma processing apparatus 400 according to the present teaching that includes a vacuum chamber with functionally separate portions where plasma conditions can be different in different sections of the loop due to at least one of local gas injection and/or the local geometry of the chamber. In various configurations, some of the functionally separate portions provide at least one conduit for the plasma and some exposure of the workpiece to reactive species generated by the plasma either directly or remotely. Many different types of reactive species can be generated. For example, in one embodiment, atomic hydrogen is generated.

More specifically, the toroidal plasma processing apparatus 400 includes a vacuum chamber with conduits 402 for supporting a toroidal plasma, a process chamber 406, and at least one magnetic core 408 around at least one of the conduits 402. The toroidal plasma processing apparatus 400 also includes a view port 410 that can also be used an igniter port.

The toroidal plasma processing apparatus 400 illustrated in FIG. 4 shows two gas introduction ports 412, 414 that can be used in various ways. It is understood that in various embodiments, any number of gas introduction ports can be used. In some of these embodiments, reactive gasses are injected in close proximity to the workpiece being processed. In some methods, gas introduction port 1 412 is used to introduce a non-reactive gas, such as argon, that provides an easily ionizable path for the plasma around most of the closed plasma loop. When the conduits 402 contain primarily argon gas, or some other kind of inert gas, the power dissipated in those regions will be less than if process gas were present, and any chemical attack on the vacuum chamber walls in those regions will be significantly reduced.

In these processes, gas introduction port 2 414 can be used to introduce process gas into the process chamber 406. Process gases typically present a higher impedance plasma load than argon alone. Consequently, the power dissipated per unit length of plasma will be greater in the process chamber 406 than in other areas of the plasma chamber that contain mostly argon. Similarly, the most aggressive plasma chemistry will be located in the process chamber 406. One feature of the toroidal plasma generator of the present teaching is that the various cooling means can be positioned where they are most needed rather than being dispersed equally around the entire plasma loop.

The various elements comprising the vacuum chamber may be electrically isolated in order to provide additional control over the plasma. These elements may be electrically floating or may be electrically biased with a DC and/or an RF power source. For example, in some configurations, the workpiece platen may be electrically floating or electrically biased. Controlling the bias on the workpiece platen can change the plasma shape or intensity in certain regions of the plasma. Also, separately biasing or floating the different sections of the vacuum chamber can provide additional control of the energy dissipation in the plasma.

The workpiece is located in the process chamber 406, typically on a platen or holder. The platen can be temperature controlled or positionally adjusted for some applications. The temperature of the workpiece can be adjusted by various means, including adjusting the physical position of the workpiece relative to the plasma, adjusting the physical position of the workpiece relative to the platen, adjusting the temperature of the platen, and adjusting the pressure of the gas between the workpiece and the platen. The temperature of the workpiece may also be adjusted by changing the emissivity of the backside of the workpiece or the emissivity of the face of the platen adjacent to the workpiece. In some systems the platen can include sensors that monitor the temperature of the workpiece at the surface adjacent to the platen. The sensor can be part of a closed-loop feedback system used to automatically control the process temperature at the growth surface. Alternatively, sensors may monitor the temperature of the workpiece at its growth side. Sensors may also be used to monitor the nucleation and the growth rate of films deposited on the growth side of the workpiece. Both functions may in some cases be integrated into the same sensor.

Another feature of the toroidal plasma source 400 of FIG. 4 is that the process chamber 406 can have larger dimensions or larger cross sectional areas compared with the plasma conduit portions 402. This geometry provides several benefits. For example, the power that needs to be absorbed from the plasma by the process chamber 406 will be absorbed into a larger area, reducing the power density on the walls. Also, the region of highest plasma density and highest gas temperature will be more distant from the walls, which will reduce the cooling requirements and allows the active chemical species to be partially neutralized, totally neutralized, or recombined before reaching the walls. In addition, using a process chamber with larger dimensions or larger cross sectional areas than the plasma conduit portions allows for a larger workpiece size and/or allows for known mechanical means that rotate or move the workpiece to improve process uniformity.

Figure 5:
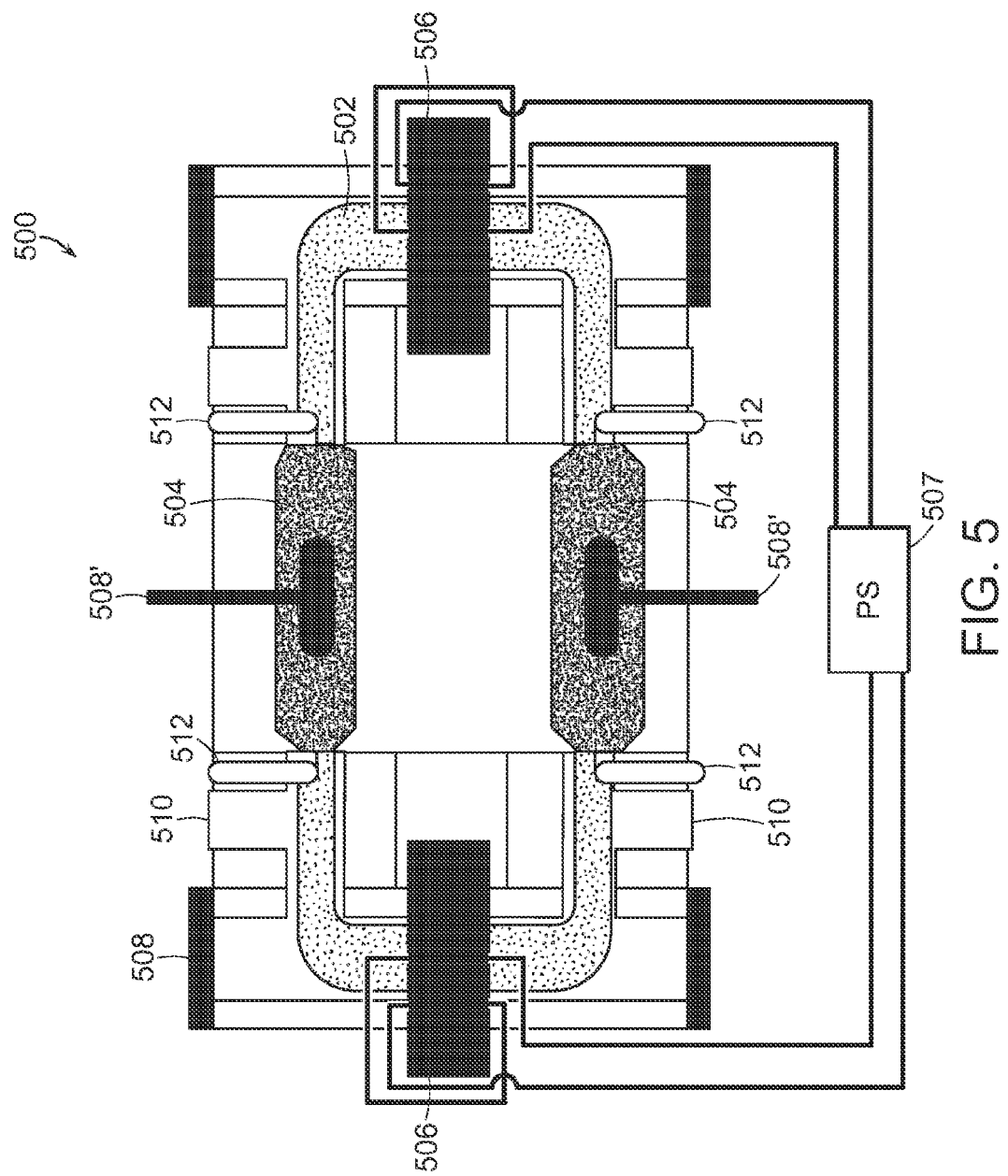
FIG. 5 illustrates a toroidal plasma processing apparatus of the present teaching that includes two plasma loop sections in the process chamber with adjustable gas restriction between the process chamber and the conduit chamber.

FIG. 5 illustrates a toroidal plasma processing apparatus 500 of the present teaching where two separate portions of the plasma loop propagate through a single process chamber. In this configuration, the vacuum chamber has separate portions that maintain the plasma loop and allow the sample to be directly exposed to reactive species in the plasma. In the configuration shown in FIG. 5, two separate plasma loop sections propagate through the process chamber, but in other configurations three or more separate plasma loop sections run through the process chamber. In various configurations, the two separate portions of the plasma loop provide a higher volume of workpiece material to be processed. Alternatively or in addition, the two separate portions of the plasma loop can provide at least one of greater process rates, improved process uniformity, or altered chemistry choices.

In other configurations, the toroidal plasma processing apparatus has multiple separate process chambers. There are many different possible configurations for this embodiment. For example, this aspect of the present teaching is not limited to C-shape plasma conduits. Numerous other shapes are possible. In addition, plasma conduits can be composed of a single conduit or can be two or more separate conduit pieces connected together. In fact, the toroidal plasma processing apparatus can have any configuration where there is at least one locally different concentration of reactive gas, pressure, and/or temperature.

Plasma conduits and process chamber elements may be constructed in numerous ways. Some methods of fabrication include machining, molding, casting, extruding, and 3D printing. The various construction techniques for ceramic and composite pieces have different features depending on the material. For example, with 3D printing, internal elements, such as cooling, gas introduction, and mounting elements, may be built into the ceramic pieces as they are constructed. This may provide a number of advantages, such as lower cost, better thermal management, better plasma control, and a reduced number of vacuum, water, and gas seals.

The conduits and the process chambers may be constructed from a variety of materials, such as aluminum, anodized aluminum, stainless steel, aluminum oxide, sapphire, aluminum nitride, various composite materials, and numerous other ceramic materials. Spray coating or other techniques may be used to coat metals such as aluminum or stainless steel to increase resistance to chemical attack. Even residual amounts of process gas that diffuse into these regions can result in chemical attack. In some embodiments, the use of insulating coatings on metal surfaces or completely insulating materials, such as ceramic materials and some composite materials, assist in limiting electrical arcing from the plasma to the walls, which can cause both hardware and process failures. Refractory metals, such as tungsten and molybdenum, can be used for higher temperature operation.

FIG. 5 illustrates a toroidal plasma processing apparatus 500 of the present teaching that includes two plasma loop sections with adjustable gas restriction between the conduits 502 and the process chambers 504. At least one magnetic core 506 surrounds at least one conduit 502. An output of the power supply 507 is electrically connected to the magnetic core 506. The toroidal plasma processing apparatus 500 also includes multiple gas input ports 508, 508' for providing inert and process gases. In some embodiments, the input port 508 is used to introduce an inert gas, such as argon, and the input ports 508' are used to introduce process gases. Similarly, toroidal plasma processing apparatus 500 also include multiple pumping outlet ports 510 coupled to a vacuum pump. One feature of the toroidal plasma processing apparatus 500 of the present teaching is that the multiple pumping outlet ports 510 can be used to pump different portions of the plasma loop at different rates, thereby creating pressure differentials in different sections of the plasma loop.

In this configuration, gas distribution can be optimized through the separate gas channels within the process loop. The optimized flow can enhance uniformity on fixed substrates, rotating substrates, or overlapping plasma loops. FIG. 5 also illustrates a toroidal plasma source 500 of the present teaching that includes two plasma loop sections in the process chamber with adjustable gas restriction between the process chamber 504 and the conduits 502. A variable restriction or gate 512 may be placed in positions between the process chamber 504 and each of the conduits 502. The gate 512 allows process parameters in the process chamber 504 to be optimized with some separation from the conduits 502.

In the configuration shown in FIG. 5, the outlets of the conduits 502 are shown to have a reduction in cross-sectional area as they transition from one region, such as an argon-purged region, to the process chamber 504. The change in cross-sectional area at this transition region reduces the flow of purge gas into the process chamber 504, while still inhibiting flow or diffusion of the process gases into the purged region. However, one skilled in the art will appreciate that the cross-sectional area changes are not desirable in all applications. The cross-section area needed for the plasma to pass through will limit the allowable change in cross sectional area. The optimum cross-section area will be determined by the process conditions over a range of pressures of 1 Torr to 200 Torr. For some geometries and conditions, the minimum cross section area will be approximately 0.25 cm$^2$.

One feature of the toroidal plasma source 500 illustrated in FIG. 5, with gas restriction between the process chamber and the plasma conduit chamber, is that the gas pressure and gas composition can be separately optimized for each conduit 502. Another feature of the toroidal plasma source 500 shown in FIG. 5 is that the conduits 502 can be purged with argon or another inert gas or mix of gases while the plasma loop sections going through the process chamber 504 are exposed to process gases.

Figure 6:
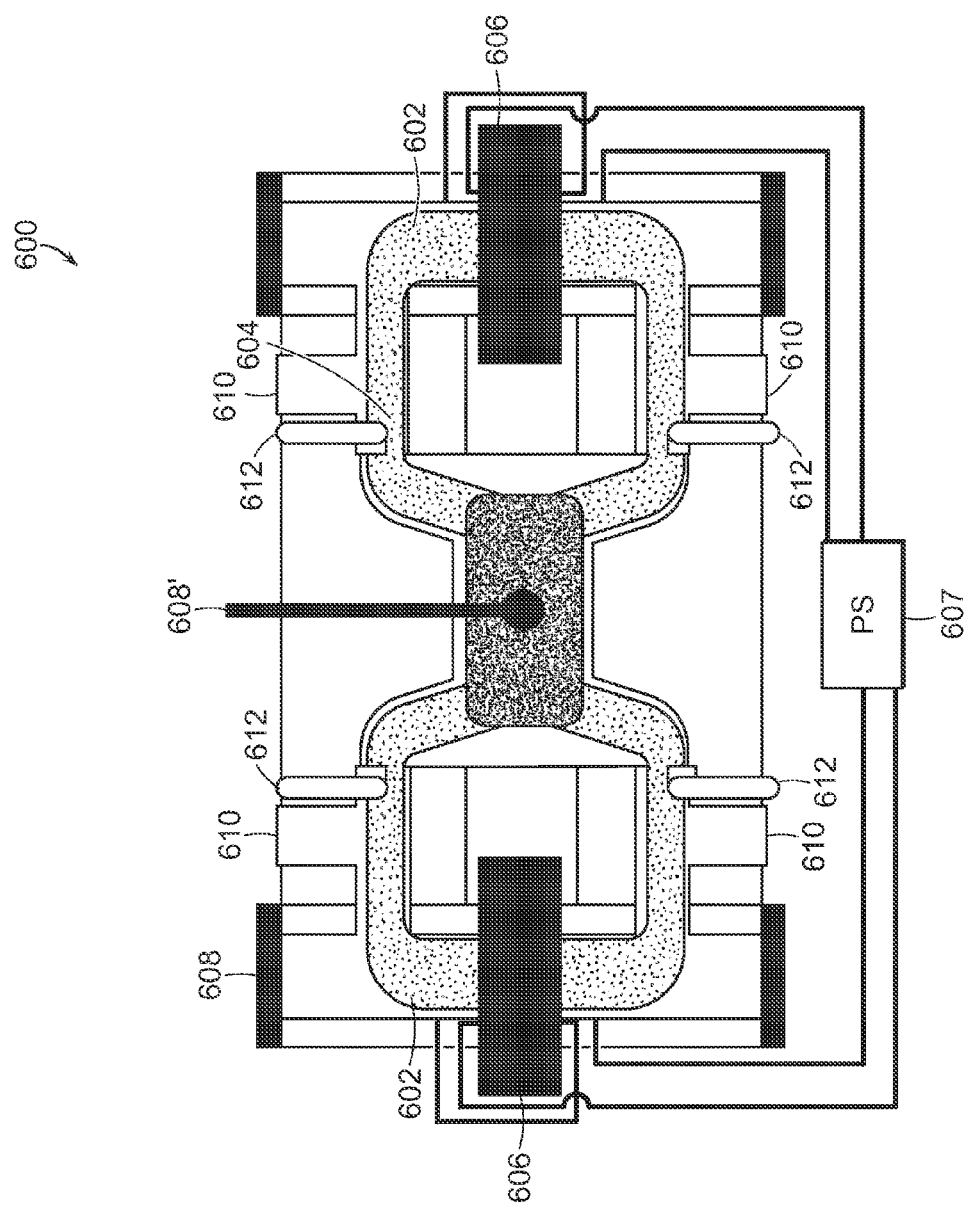
FIG. 6 illustrates a toroidal plasma processing apparatus of the present teaching that includes two plasma sections in close proximity or intermingling in order to create a region of higher plasma density and gas temperature.

FIG. 6 illustrates a toroidal plasma processing apparatus 600 of the present teaching that includes two plasma loop conduit sections 602 in close proximity, or intermingling, in order to create a region of relatively high plasma density and gas temperature. The toroidal plasma processing apparatus 600 of FIG. 6 is similar to the toroidal plasma processing apparatus 600 described in connection with FIG. 5 and contains many of the same elements. The toroidal plasma processing apparatus 600 includes an adjustable gas restriction between the conduits 602 and the process chamber 604. At least one magnetic core 606 surrounds at least one conduit 602. An output of the power supply 607 is electrically connected to the magnetic core 606. The toroidal plasma processing apparatus 600 also includes multiple gas input ports 608, 608' for providing inert and process gases. In some embodiments, the input port 608 is used to introduce an inert gas, such as argon, and the input ports 608' are used to introduce process gases. Similarly, toroidal plasma processing apparatus 600 also includes multiple pumping outlet ports 610 coupled to a vacuum pump. One feature of the toroidal plasma processing apparatus 600 of the present teaching is that the multiple pumping outlet ports 610 can be used in some embodiments to pump different portions of the plasma loop at different rates, thereby creating pressure differentials in different sections of the plasma loop.

One feature of the toroidal plasma processing apparatus 600 shown in FIG. 6 is that the two plasma loop conduit sections 602 that are in close proximity or that are intermingling create a region of relatively high plasma density and gas temperature that can be used for applications that require high density plasma processing, such as deposition of diamond and diamond-like coatings. Another feature of the toroidal plasma processing apparatus 600 shown in FIG. 6 is that it provides an increased process area where a larger single workpiece can be processed.

Figure 7:
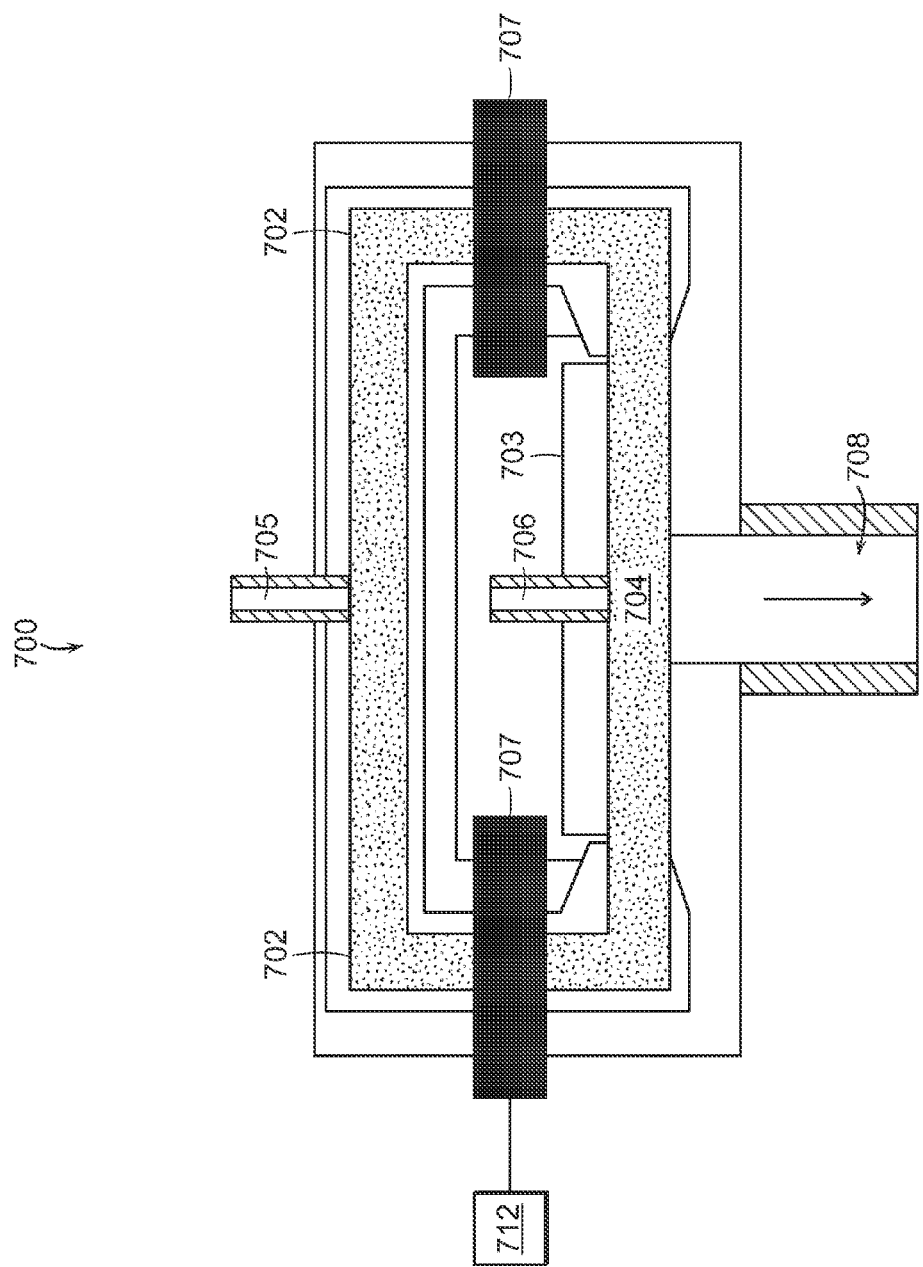
FIG. 7 illustrates a remote or downstream toroidal plasma source for generating reactive gas species according to the present teaching.

FIG. 7 illustrates a remote or downstream toroidal plasma source 700 for generating reactive gas species according to the present teaching. In this configuration, the workpiece is not in the immediate vicinity of the plasma, but rather at a distance downstream from the plasma source. Typical applications for this embodiment include surface cleaning, etching, deposition, and cleaning the walls of a process chamber, such as a deposition or etch chamber.

The remote toroidal plasma source 700 according to the present teaching includes a vacuum chamber comprising conduits 702, a reaction chamber 703, a first gas input port 705 in a first location for introducing an inert gas into the vacuum chamber, a second gas input port 706 for introducing a process gas in a second location, and a reactive gas outlet 708 for passing reactive species generated in the reaction chamber 703.

One feature of the remote toroidal plasma source 700 is that at least one of pressure and reactive gas concentration in the process chamber 703 is different from at least one of the pressure and the reactive gas concentration in the conduits 702. A magnetic core 707 surrounds at least one of the conduits 702. An RF power supply 712 has an output that is electrically connected to the magnetic core 707. The RF power supply 712 energizes the magnetic core 707, thereby forming a toroidal plasma loop discharge in the vacuum chamber that generates reactive species for downstream processing.

In one method of operating the remote plasma source, argon gas is injected into the plasma conduit regions 702. The process gases 706 to be dissociated are then fed into the open portion of the loop 704. In some methods, the operating pressure in the region of the open loop 704 will be in the range of 0.5 to 40 Torr and the combined flow rates of argon (or other inert gas) and process gases 706 will be in the range of 0.5 slm (standard liters per minute) to 40 slm. The minimum value of the operating pressure is set by the need to transport the dissociated, reactive species 708 quickly out of the remote plasma source 702 and to the workpiece before recombination. The maximum value of the operating pressure is set by practical pumping capabilities of the processing system.

In the remote plasma source 700, the charged species generated in the plasma often recombine before they reach the surface of the workpiece. For many plasma chemistries, only the reactive neutral species effectively reach the surface of the workpiece. Typical process gases 706 used with the remote plasma source include hydrogen, oxygen, nitrogen, nitrogen trifluoride, molecular fluorine, chlorine, bromine, various fluorocarbons and hydrogen-containing gases, and other gases. These gases can be used alone or in conjunction with other gases.

Another feature of the remote toroidal plasma source 700 shown in FIG. 7 is that the plasma loop 704 propagates through an open chamber region. Consequently, the chemical interaction of the plasma species with the chamber wall is reduced compared with other embodiments described herein. In addition, physical interactions with the plasma chamber walls are also significantly reduced compared with other embodiments described herein. One feature of the remote plasma source of the present teaching is that the heat load due to the plasma is spread out over a larger wall area in the process chamber.

Figure 8:
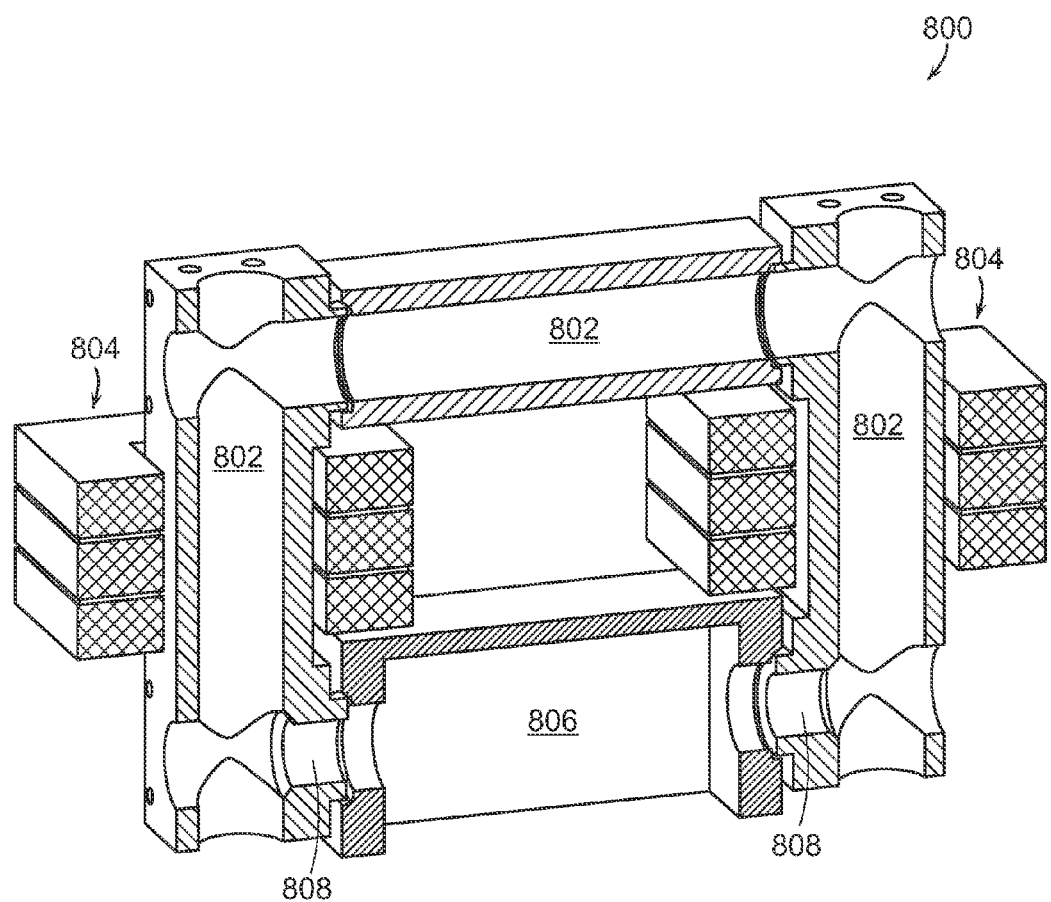
FIG. 8 illustrates an embodiment of a toroidal plasma processing apparatus according to the present teaching that includes a single plasma loop comprising three conduits and a process chamber.

FIG. 8 illustrates an embodiment of the toroidal plasma source 800 comprising three conduits 802, with magnetic cores 804 surrounding two of the conduits 802, and a process chamber 806. In one specific embodiment, the inner diameter of the plasma conduits 802 is about 2.54 cm. Other configurations have conduits with inner diameters that are as small as 0.5 cm. In some configurations, the transition regions 808 between at least some of the plasma conduits 802 and the process chamber 806 are reduced in diameter. In one specific configuration, the transition region has an inner diameter of about 2.0 cm, but in other configurations, the transition region may have an inner diameter that may be as small as 0.5 cm and as large as the process chamber opening.

The toroidal plasma source 800 shown in FIG. 8 includes two magnetic cores 804. In various other configurations, one or more than two magnetic cores are used. The number of magnetic cores 804 depends on the voltage and power needed to sustain the plasma loop. In one specific configuration, the three plasma conduits 802 and the process chamber 806 are each approximately 15 cm long. In one specific operating mode of the single loop toroidal plasma source 800 shown in FIG. 8, the power supply driving the primary windings on the two magnetic cores 804 has a frequency of 400 kHz and a maximum power output of 14 kW. In other operating modes, the frequency and power can range from 50 kHz to 14 MHz or greater and 2 kW to 100 KW or greater.

One advantage of the toroidal plasma processing apparatus of the present teaching is that the shape of the deposition region can be tailored by the source construction. For example, if a linear deposition region is desired, the toroidal plasma processing apparatus can be constructed such that there is a straight process region. If a circular deposition profile is desired, the toroidal source can be constructed in a circular shape.

Another advantage of the toroidal plasma processing apparatus of the present teaching is that it may be combined with motion of either the source or the workpiece in order to promote uniform processing over a large area. Microwave and other types of plasma sources do not have this flexibility.

Figure 9:
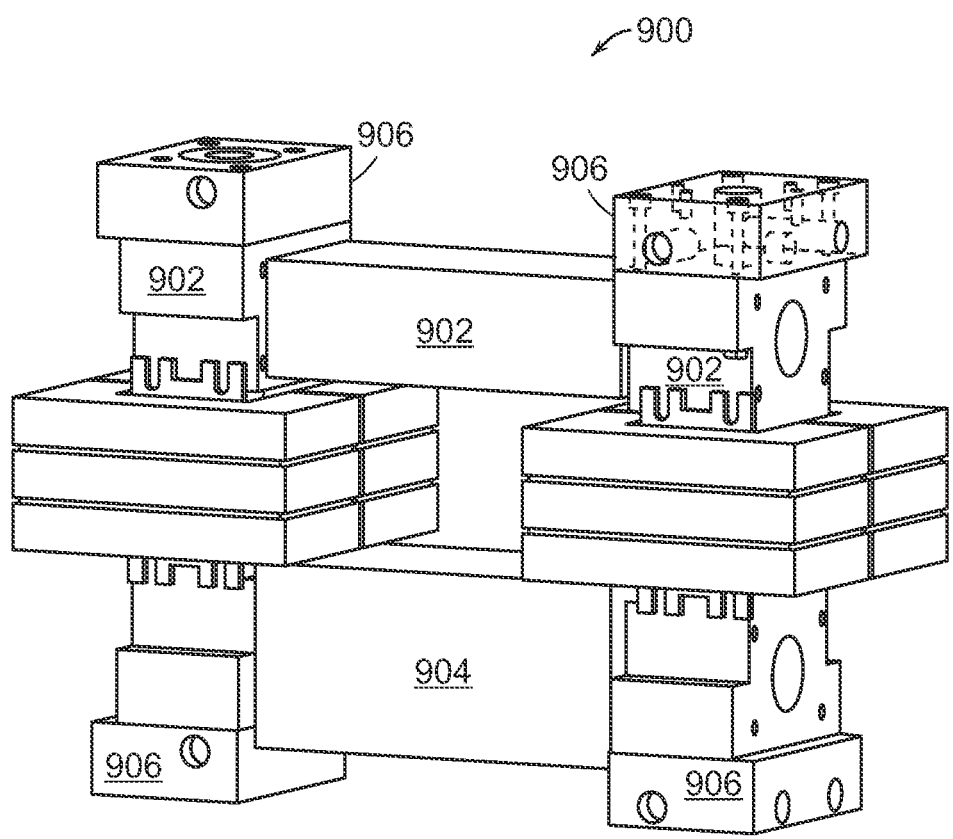
FIG. 9 illustrates an isometric view of a single plasma loop toroidal plasma processing apparatus according to the present teaching.

FIG. 9 illustrates an isometric view of a single plasma loop toroidal plasma processing apparatus 900 according to the present teaching. In one specific embodiment, the vacuum chamber includes plasma conduits 902 and at least one process chamber 904. The conduits 902 are formed of aluminum nitride, but in other embodiments, the plasma conduits 902 are formed of other ceramic materials, such as aluminum oxide, or metals, such as aluminum, anodized aluminum, stainless steel, or other metallic materials that are uncoated or coated by an insulating coating. Ceramic conduits 902 may be fabricated by a number of different techniques, including molding, machining, and 3D printing. It is also possible and desirable in some cases to make the entire vacuum chamber out of a single piece of ceramic, with gas inputs located at various points along its length.

The conduits 902 are liquid-cooled with cooling passages that are internal to the plasma conduits 902. The conduit sections 902 can also be cooled with liquid-cooled heatsinks that are thermally attached to the conduit sections. In addition, the conduit sections 902 can be cooled with water or other fluids flowing on the outside of the conduit sections 902. In some cases, the conduit sections 902 are cooled by air flow due to the fact that the power dissipation is reduced in the conduit sections 902 when argon is used.

The endcaps 906 illustrated on the top of the plasma processing apparatus provide connections to the plasma source for water cooling, process gases, and vacuum. The endcaps 906 also provide connections for optical viewports and various diagnostic and measurement elements. The endcaps 906 may be constructed of various insulating or metallic materials. In embodiments where the endcaps 906 are constructed of metallic material, it may be desirable in some cases to electrically isolate some or all of the endcaps 906 in order to reduce the probability of generating an arc discharge.

Figure 10:
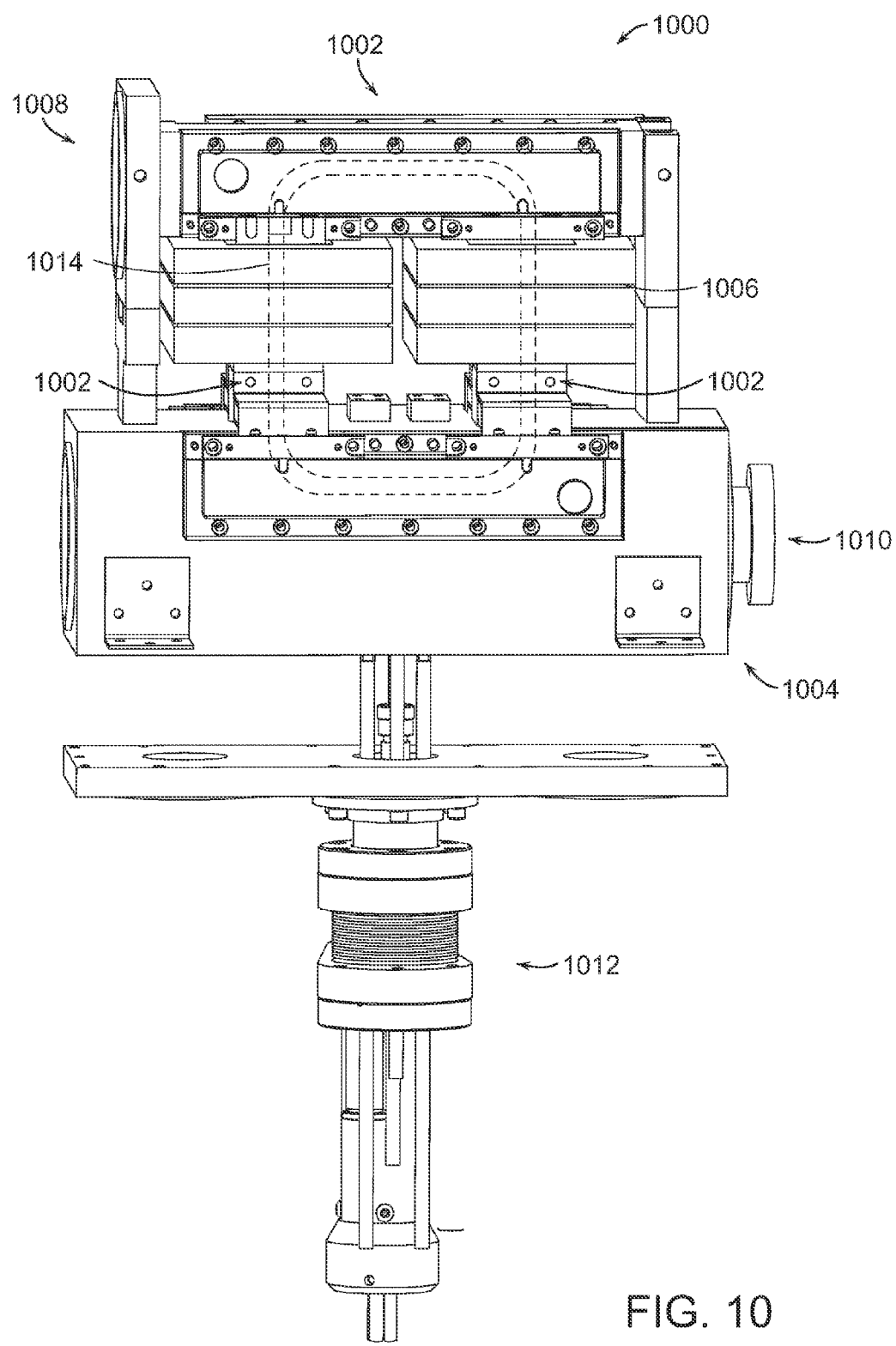
FIG. 10 illustrates a toroidal plasma processing apparatus according to the present teaching used to carry out experiments.

FIG. 10 illustrates a toroidal plasma processing apparatus 1000 used to carry out experiments according to the present teaching. The plasma processing apparatus 1000 includes three conduits 1002 and a process chamber 1004. Two magnetic cores 1006 are shown, but any number of magnetic cores can be used in various positions. Additional external permanent magnets or electromagnets can be included to generate an external magnetic field for various purposes, including optimizing the uniformity of the plasma, moving the plasma to a particular area, and/or changing the shape of the plasma to a desired area. For example, permanent magnets can be operatively positioned to generate a magnetic field strength that is approximately 1,000 Gauss. Experiments have been performed to show that external magnets can be used to move the plasma several millimeters in a desired direction.

The source also includes an argon introduction port 1008 and an igniter port 1010 used for initially establishing the plasma. A stage assembly 1012 for the workpiece platen is shown below the process chamber 1004 and is described in detail in FIG. 11. The plasma loop 1014 is indicated.

In various embodiments, structures that provide a guide that directs the plasma in a straight path can be integrated into either the process chamber 1004 or the stage 1012. In the toroidal plasma source 1000 shown in FIG. 10, a trough-shaped structure having width that is in the range of 1.0-6.0 cm, and a depth that is in the range of 0.5-5.0 cm was optionally fastened to the workplace holder (See FIG. 11). The trough-shaped structure guides the plasma in a straight path over the tested range of operation from 10-200 Torr, with various mixtures of Ar, $H_2$, and $CH_4$. Thus, the toroidal plasma source 1000 according to the present teaching provides a predictable straight path for the exposed plasma loop 1014. Depending upon the application, the guiding structure can also be used to guide the plasma in a non-linear path.

Many methods of operation require measuring and controlling the temperature of the process chamber walls in order to promote controlled wall depositions. For example, in some methods of operation, the chamber wall temperature may be set such that deposition occurs rather than material removal. This protects the wall surfaces and improves the quality of the deposited film. Chamber wall heating can work in conjunction with a pre-coating step, or can be independent of a precoating step. Chamber wall heating can also be used to promote collection of the deposited material on the walls, which then act as extended workpiece areas. Choosing an appropriate wall material will also assist in promoting collection of deposited material on the walls. For example, tungsten or molybdenum walls can be used and operated at temperatures between 300 C and 1300 C in order to promote the deposition of CVD diamond, related diamond-like materials graphene, and similar carbon-based materials on the walls.

Figure 11:
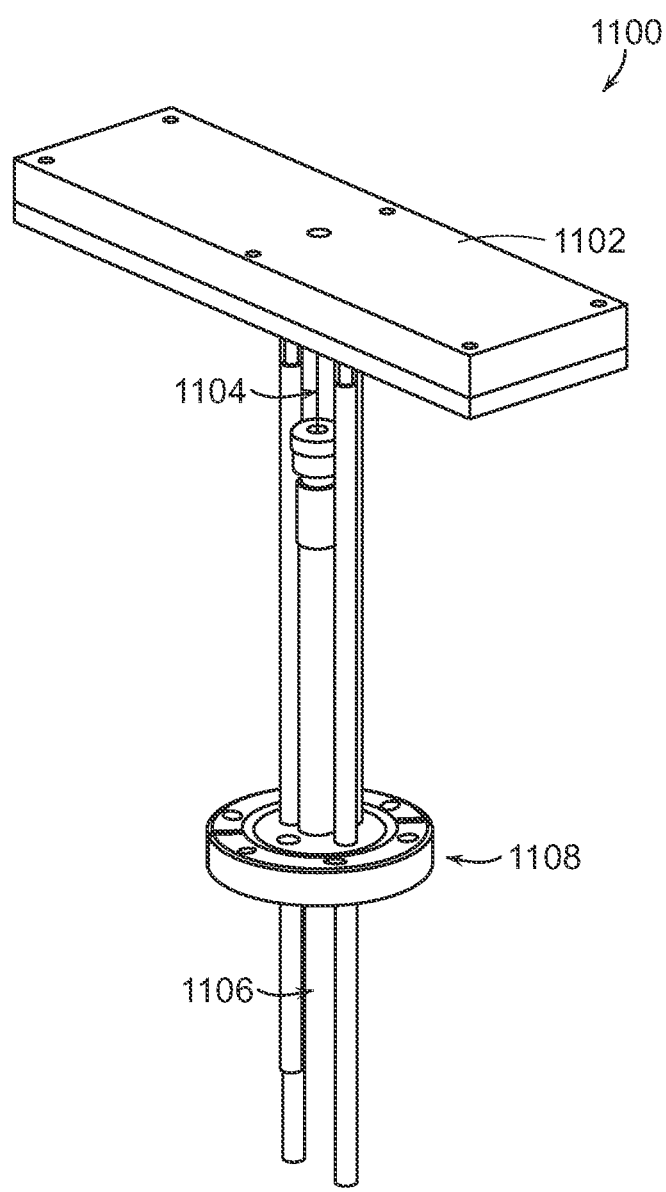
FIG. 11 illustrates a perspective view of a workpiece platen for supporting the workpiece that can be used with the toroidal plasma processing system of the present teaching.

FIG. 11 illustrates a perspective view of a workpiece platen assembly 1100 that includes a platen 1102 for supporting the workpiece that can be used with the toroidal plasma source of the present teaching. A workpiece is mounted on a platen 1102 and inserted into the process chamber of the toroidal plasma processing system of the present teaching. In some methods of operation, the workpiece can be held and inserted towards the plasma discharge region while continuously monitoring the workpiece temperature.

Many processes require that the temperature of the workpiece be monitored and controlled during the process. The workpiece platen 1102 has a built-in temperature sensor 1104 that measures the workpiece temperature during the plasma processing and sends a signal to a controller that may be used to control the process based on the temperature. In one specific embodiment, the temperature is measured by use of a fiber-based pyrometer that views the backside of the workpiece. A toroidal plasma source was built that included a dual wavelength pyrometer manufactured by Omega Inc., and sold as model number IR-2C. This pyrometer uses a custom-designed sapphire probe positioned within a centimeter of the workpiece to measure the backside temperature of the workpiece. By viewing the backside of the workpiece rather than the front side of the workpiece, interference from the plasma light is avoided. The backside of the substrate is also not directly exposed to process gases that change emissivity. These changes make pyrometer-based temperature measurement more difficult and less accurate. In this system, the workpiece platen 1102 is on a vacuum stage that is movable so that the workpiece is positioned relative to the plasma and can be adjusted while the plasma is present. Separate elements may be used to shield both the backside of the workpiece and the pyrometer from light emitted by the plasma and from reactive gases in the plasma.

The workpiece temperature can be varied and controlled in several ways. The workpiece platen assembly 1100 also includes fluid cooling lines 1106 that are fed through a vacuum flange 1108. In many systems, water cooling is used because it is has relatively high thermal conductivity and thus is efficient and because it does not add to the operating cost of the system. Some embodiments of the workpiece platen assembly 1100 include motion controls that change the position of the workpiece relative to the plasma so that both the workpiece temperature and the process environment at the workpiece surface will be changed. Changing the size of the gap between the backside of the workpiece and the workpiece holder 1102 changes the thermal conduction between the workpiece and the workpiece platen 1102, thereby changing the workpiece temperature. By introducing a gas to control pressure between the backside of the workpiece and the workpiece platen 1102, the thermal conduction between the workpiece and the workpiece platen 1102 will be changed, thereby changing the workpiece temperature.

Another aspect of the present teaching in FIG. 11 is that the backside region of the workpiece can be blocked off from the depositing species coming from the plasma discharge so that unwanted deposition onto the backside is avoided. One feature of the present teaching is that a purge gas can be introduced into the backside region in order to assist in keeping it free of unwanted gases. The purge gas can be one of the process gases, or it can be an inert gas such as argon and helium.

Numerous experiments were performed to reduce the present teaching to practice using a toroidal plasma processing apparatus similar to the one shown in FIG. 10. Argon gas was fed into the gas introduction port in the upper chamber to initiate deposition. However, the use of argon for ignition and/or for purging the plasma conduit sections is in no way a limitation of this invention. Numerous other gases, such as any noble gas including helium, neon, krypton, and xenon, may also be used. Also, in some methods of the present teaching, nitrogen gas is used alone or in combination with other gasses. In some methods according to the present teaching, the process gas can be used for ignition and for operation throughout the entire plasma vessel.

To initiate operation, gas flow is established throughout the vacuum chamber, with the gas pumped out from the bottom of the process chamber. The argon flow rate was varied between 100 sccm and 3000 sccm in order to obtain repeatable plasma ignition. In the specific configuration tested, the spacing between centers of the connecting plasma chambers was 10 centimeters. A minimum argon flow rate of 300 sccm provided consistent plasma ignition. Larger spacing is expected to require a correspondingly large argon flow rate for consistent ignition.

The plasma was initiated with a plasma igniter, along with the application of RF power at 400 kHz to the primary windings of the magnetic cores. The sequencing of the igniter operation and the application of the RF power was managed automatically by the onboard control system. The igniter can be positioned elsewhere in the plasma loop and in many embodiments is expected to have repeatable plasma ignition regardless of its position.

Once the plasma loop is established with argon gas, the process gas mixture was fed into the process chamber. The argon gas flow was adjusted to a desired flow, which can be higher or lower than the argon flow used to ignite the plasma. In many methods, the argon flow rate is adjusted to substantially prevent process gases from entering the portion of the plasma loop that is not within the process chamber. The process gas can also be adjusted to provide some dilution of the process gases within the process chamber in order to allow the flux of reactive gas species that reach the surface of the workpiece to be adjusted, thus changing process rates and process conditions.

In various experiments, the total gas pressure was varied between 10 and 200 Torr and the flow rate of each gas was varied between 0 and 2,000 sccm. The AC line power used in various experiments was measured with an AC power meter to be in the range of 2.5 kW and 14 kW. Temperature measurements were performed for a workpiece positioned within the plasma channel at a distance that was less than 2 cm from the plasma core. These process conditions were 100 sccm $H_2$ gas flow, 250 sccm Ar gas flow, with a total gas pressure of 15 Torr. In these experiments, the measured substrate temperature rapidly rose to exceed 1,000° C., indicating that a significant flux of atomic hydrogen is reaching the workpiece surface.

Diamond and graphene films were deposited on molybdenum and silicon workpieces. Deposition was accomplished by dissociating atomic hydrogen generated in the discharge with RF power coupled into the plasma discharge region that generally has a volumetric power density greater than about 10 W $cm^{-3}$. The RF power coupled into the plasma was typically 6,000-11,000 W. In some experiments, the gas flow conditions used for diamond deposition included flowing argon at a rate of 1000 sccm into the upper chamber, flowing hydrogen at a rate of 300 sccm into the process chamber, and flowing methane at a rate of 4.7 sccm into the process chamber. The pressure in the process chamber is typically greater than 1 Torr.

The workpiece stage was moved into a position such that the workpiece temperature was measured with the pyrometer to be approximately 900 C. The workpiece temperature was monitored with a sapphire fiber positioned less than 10 mm away from the backside of the workpiece. The light collected by the sapphire fiber was fed into a dual-wavelength pyrometer that measured the workpiece temperature over a range from about 350 C to 1200 C.

For some experiments, the measured deposition rates of diamond on the workpiece were approximately 7 microns/hour, averaged over a workpiece area of 13 $cm^2$. The peak rates on the workpiece were measured to be in excess of 40 microns/hour for some process conditions. In some experiments, argon and process gas flow rates were adjusted to result in process pressures that were in the range of 2 Torr to over 200 Torr. The process rates were limited only by the particular power supply and by the physical characteristics of the magnetic cores that were used in the experiments. The diamond film composition was confirmed through the use of a scanning electron microscope, x-ray diffraction, and Raman spectroscopy.

The toroidal plasma source of the present teaching was also used to grow graphene. The gas flow conditions used for the graphene deposition included flowing argon at a rate of 800 sccm into the upper chamber, flowing hydrogen at a rate of 250 sccm into the process chamber, and flowing methane at a rate of 20 sccm into the process chamber. The total chamber pressure was 7 Torr. The workpiece temperature was about 977 degrees C. The RF power was about 6200 W.

One feature of the toroidal plasma processing apparatus of the present teaching is that it is relatively easy to clean the apparatus after performing a deposition cycle. During cleaning, the toroidal plasma source is operated under conditions where gases are dissociated into reactive species that clean deposits from the chamber walls. For example, oxygen-containing cleaning gas chemistries and hydrogen-containing gas chemistries are effective in cleaning the walls and other interior components containing carbon-based materials. In various methods, other gases such as fluorine or water vapor may be added to assist the cleaning process.

The methods and apparatus described herein are not limited to processes using hydrogen, argon, and methane, and are not limited to deposition of diamond, graphene, and other carbon-based films. There are, in fact, numerous applications for the toroidal plasma processing apparatus of the present teaching. Such apparatuses are particularly well suited for processes that expose a workpiece to a high-density and/or high temperature plasma.

The method and apparatus of the present teaching have particular advantages over many other types of known plasma processing apparatus when operating under conditions where the partial pressure of active process gases is greater than about 1 Torr, and where the power densities in the plasma discharge are 10 W cm$^{-3}$ and greater. Under these conditions, the gas temperature in the plasma region will be quite high, typically above 2,000° C., helping to effectively dissociate and to maintain a highly dissociated gas. Without this high gas temperature, rapid recombination will occur in the gas when dissociating molecular gases such as hydrogen, nitrogen, and oxygen.

One skilled in the art will appreciate that the toroidal plasma source described herein has numerous features and advantages over known systems. One feature of the toroidal plasma processing system of the present teaching is that it can be easily customized for different applications. For example, different applications require different vacuum pumping configurations. For some applications, the quality of the film is very sensitive to the presence of residual gases. For example, one or more of oxygen, nitrogen, and water vapor from various sources, such as small leaks into the vacuum vessel, from adsorbed gases within the chamber, or from erosion of chamber components, can cause undesirable changes in some films. In other applications, it is desirable to introduce small quantities of additional gases, such as oxygen, nitrogen, and various halogens in the process chamber in a controlled manner. In processes where residual gases are significant factors in the process, it is desirable to have a vacuum chamber with an achievable base pressure of 10$^{-7}$ Torr or better. In some processes, it is desirable to have the evolution of non-process gases into the process chamber, from either the internal walls or from the outside, while the plasma is either on or off, at flow rates that are less than 10$^{-2}$ standard cubic centimeters per minute (sccm).

One feature of the toroidal plasma source of the present teaching is that the apparatus is scalable in area and may be used to treat a wide variety of workpiece surfaces from conventional fixed substrates to web-type substrates. There are particular advantages when processing continuously moving webs, which could be constructed of numerous types of materials, such as plastic, metals, glasses, and numerous other dielectric materials. Another feature of the toroidal plasma source of the present teaching is that it can be used to generate an area-scalable plasma discharge, which allows effective processing of large area substrates, irregularly shaped substrates, and moving substrates, such as web-based substrates. Applications include manufacturing for a diverse range of products including semiconductors, displays, photovoltaics, cutting tools, optical and microwave windows, and many other specialized devices. The interior surfaces of conduits can be coated or otherwise treated with the toroidal plasma source.

The methods and apparatus of the present teaching are particularly useful for depositing films requiring a high flux of atomic hydrogen. Such films include diamond, diamond-like-carbon, graphene, and other materials. Applications of the method and apparatus of the present teaching include, but are not limited to, depositing films such as diamond and graphene, aluminum oxide, sapphire, gallium nitride, and many other simple and complex metals and insulations, oxides, and nitrides.

EQUIVALENTS

While the Applicants' teaching is described in conjunction with various embodiments, it is not intended that the Applicants' teaching be limited to such embodiments. On the contrary, the Applicants' teaching encompasses various alternatives, modifications, and equivalents, as will be appreciated by those of skill in the art, which may be made therein without departing from the spirit and scope of the teaching.

What is claimed is:

1. A method of CVD plasma processing for depositing at least one of diamond, diamond-like-carbon, or graphene comprising:
   a) forming a vacuum chamber comprising a conduit and a process chamber;
   b) introducing a gas into the vacuum chamber;
   c) applying an RF electromagnetic field to a magnetic core to form a toroidal plasma loop discharge in the vacuum chamber;
   d) positioning a workpiece in the process chamber for plasma processing at a distance from a hot plasma core to a surface of the workpiece that is in a range from 0.1 cm to 5 cm; and
   e) introducing a gas comprising hydrogen to the workpiece so that the toroidal plasma loop discharge generates atomic hydrogen.

2. The method of claim 1 wherein the gas comprises argon gas.

3. The method of claim 1 further comprising introducing a gas comprising hydrogen to the workpiece to achieve a pressure of hydrogen that is in the range of 1 Torr to 200 Torr.

4. The method of claim 1 further comprising coupling an RF electromagnetic field so that the power density of the plasma is at least 100 W cm$^{-3}$ at a distance from the hot plasma core to the surface of the workpiece in the range 0.1 cm to 5 cm.

5. The method of claim 1 further comprising translating the workpiece relative to the plasma to improve uniformity of the CVD plasma processing.

6. The method of claim 1 further comprising rotating the workpiece relative to the plasma to improving uniformity of the CVD plasma processing.

7. The method of claim 1 further comprising controlling a temperature at the surface of the workpiece by controlling a temperature of a platen supporting the workpiece.

8. The method of claim 1 further comprising controlling a temperature at the surface of the workpiece by adjusting a position of a platen supporting the workpiece relative to the hot plasma core.

9. The method of claim 1 further comprising controlling a temperature at the surface of the workpiece by adjusting a pressure of the gas comprising hydrogen proximate to the workpiece.

10. The method of claim 1 further comprising electrically biasing the platen to change a shape of the plasma proximate to the workpiece.

11. The method of claim 1 further comprising adjusting a gas flow between the process chamber and the conduit.

12. The method of claim 1 further comprising introducing a carbon-containing gas to the workpiece.

13. The method of claim 1 further comprising measuring a temperature of the workpiece and adjusting an RF power of the RF electromagnetic field in response to the measurement.

14. The method of claim 1 wherein a partial pressure of hydrogen inside the conduit is different from a partial pressure of hydrogen inside the process chamber.

15. The method of claim 1 wherein the forming the vacuum chamber further comprises forming the process chamber with a cross-sectional area that is greater than a cross-sectional area of the conduit.

16. The method of claim 1 wherein the forming the vacuum chamber further comprises forming the conduit from a dielectric material chosen from a group consisting of fused silica, aluminum oxide, aluminum nitride, composite material, and sapphire, wherein the conduit can be formed of the same or from a different material.

17. The method of claim 1 wherein the forming the vacuum chamber further comprises forming the conduit and forming the process chamber from a conductive material chosen from a group consisting of aluminum, steel, copper, tungsten, molybdenum, and alloys of aluminum, steel, copper, nickel, tungsten, and molybdenum, wherein the conduit and the process chamber can be formed of the same or from a different material.

18. The method of claim 1 wherein the forming the vacuum chamber further comprises forming the conduit with a cross-sectional area that changes proximate to the process chamber.

19. The method of claim 1 wherein the forming the vacuum chamber further comprises forming the process chamber with an inside surface that is coated by an electrically insulating material.

20. The method of claim 1 wherein the forming the vacuum chamber further comprises forming the process chamber with an inside surface comprising a metal selected from the group consisting of aluminum, anodized aluminum, stainless steel, tungsten, and molybdenum.

21. The method of claim 1 wherein the forming the vacuum chamber further comprises mounting the conduit with an insulating collar that is arranged to prevent electrical shorting to the process chamber.

22. The method of claim 1 wherein the applying the RF electromagnetic field to the magnetic core to form the toroidal plasma loop discharge in the vacuum chamber comprises applying RF electromagnetic signals with a frequency that is in a range of 20 KHz to 14 MHz.

23. The method of claim 1 wherein the positioning the workpiece in the process chamber further comprises positioning the workpiece so that it is exposed to reactive species in both the toroidal plasma loop discharge and a second toroidal plasma loop discharge.

24. The method of claim 1 wherein the gas comprising hydrogen is introduced to the workpiece to achieve a pressure at the workpiece that is over 200 Torr.

25. The method of claim 1 wherein the gas comprising hydrogen and the gas are introduced at different gas ports.

26. The method of claim 1 wherein the gas comprising hydrogen and the gas are introduced at the same gas input port.

27. The method of claim 1 wherein the gas comprising hydrogen is introduced proximate to the workpiece.

28. The method of claim 1 wherein the applying the RF electromagnetic field to the magnetic core comprises applying the RF electromagnetic field to a magnetic core positioned around the conduit.

* * * * *